United States Patent [19]

Fukuda et al.

[11] Patent Number: 4,877,481
[45] Date of Patent: Oct. 31, 1989

[54] PATTERNING METHOD BY LASER SCRIBING

[75] Inventors: Takeshi Fukuda, Ebina; Shunpei Yamazaki, Tokyo; Akira Sugawara, Atsugi, all of Japan

[73] Assignee: Semiconductor Energy Laboratory Co., Ltd., Kanagawa, Japan

[21] Appl. No.: 200,063

[22] Filed: May 27, 1988

[30] Foreign Application Priority Data

May 28, 1987 [JP] Japan .................................. 62-13324
May 28, 1987 [JP] Japan .................................. 62-13326

[51] Int. Cl.[4] .................. B44C 1/22; C03C 15/00; C03C 25/06; C23F 1/02
[52] U.S. Cl. .................................. 156/643; 156/651; 156/645; 156/656; 156/667; 156/668; 219/121.69; 219/121.85; 427/53.1
[58] Field of Search ............... 156/643, 645, 651, 656, 156/667, 668; 427/53.1; 437/2, 3, 226; 219/121.68, 121.69, 121.85

[56] References Cited

U.S. PATENT DOCUMENTS

| | | | |
|---|---|---|---|
| 3,665,483 | 5/1972 | Becker et al. | 219/121.68 |
| 3,787,873 | 1/1974 | Sato et al. | 219/121.69 |
| 3,867,217 | 2/1975 | Maggs et al. | 156/643 |
| 3,956,052 | 5/1976 | Koste et al. | 156/247 |
| 4,037,075 | 7/1977 | Pugsley et al. | 219/121.85 |
| 4,046,986 | 9/1977 | Barker | 219/121.85 |
| 4,568,409 | 2/1986 | Caplan | 427/53.1 |
| 4,713,518 | 12/1987 | Yamazaki | 427/53.1 |

OTHER PUBLICATIONS

Bakhru et al., "Inhibiting Adhesion of Silicon Particles to the Surface of a Silicon Semiconductor Wafer During Laser Dicing"; IBM Technical Disclosure Bulletin, vol. 15, No. 4, Sep. 1972, p. 1079.

Primary Examiner—William A. Powell
Attorney, Agent, or Firm—Gerald J. Ferguson, Jr.

[57] ABSTRACT

A laser scribing method is described. A laser beam is deprived of its tail which appears along a groove which is engraved by scribing. The scribing can be performed without forming protrusion along the edge of grooves engraved by the scribing. The depriving of the tail is accomplished by coating the film with a buffer film which is removed after the scribing.

12 Claims, 6 Drawing Sheets

PATTERNING METHOD BY LASER SCRIBING

BACKGROUND OF THE INVENTION

This invention relates to a patterning method using laser scribing.

Laser scribing is a now developing technique in semiconductor manufacture for substituting conventional patterning method such as photolithography, etching or the like. This technique is advantageous in that fine patterns can be produced at a minimum spacing of 10 microns by its simplified process. The applicants have filed a Japanese Patent Application No. sho 57-206807 concerning this technique, in which is described a manufacturing process for non-single crystalline silicon semiconductor solar cell. According to this prior art invention, semiconductor materials are laminated on a glass substrate, and then the laminate members are severed by laser scribing to produced an integrated structure.

However, when the semiconductor layer is irradiated with a laser beam, protrusions 7 are formed at the both sides of a groove engraved as illustrated in FIG. 2. The spacial energy distribution of laser beam across its width is shown in FIG. 1. Side tail 6 of the distribution is the cause of the formation of the protrusion. The height of the protrusion is generally between 50% and 100% of the thickness of the layer to be processed. The protrusion tends to form adverse circuitry which interconnects the constituent layers of the laminated semiconductor and yield fissures on a film ovelying the protrusion.

There are several attempt for handling the prior art problem, such as the elimination of the protrusion by wet or dry etching. However, no effective measure has been proposed yet. Because of this, at this present, laser scribing is only applicable to semiconductor devices which are less affected by the formation of the protrusions, or the patterning of thin films such as solar cell manufacture.

SUMMARY OF THE INVENTION

It is therefore an object of the invention to provide a laser scribing method for patterning without forming protrusion.

In order to accomplish the above and other objects, a buffer film of an organic resin is formed over the surface to be processed. A laser beam having a short wavelength, preferably 400 nm or less is deprived of its side tails by passing through the buffer film and radiated to the processed film. In this case, protrusion may be formed by the edges of the groove engraved by that method. Anyway, after removing the buffer film, the processed film is provided with its even edge. Depending on the condition, the acceptible shallow protrusion might remain on the processed film. The height of the protrusion is controlled by suitably selecting the kind of material of the buffer film or the height thereof so as not to cause adverse effects.

DETAILED DESCRIPTION OF THE PREFERRED EMBODIMENTS

Referring to FIGS. 3(A) to 3(E), a method of forming a photoelectric conversion device of a laminate type in accordance with the present invention is described. On a commercially available glass substrate 1 is deposited a conductive transparent $SnO_2$ film 2 by thermal CVD with 4500 Å in thickness. Further, a 7000 Å thick amorphous Si film 3 incorporating a NIN junction therein is formed on the $SnO_2$ film 2 by plasma CVD (FIG. 3(A)). The deposition condition for both CVD methods is as well-known in the art.

Figure 1:
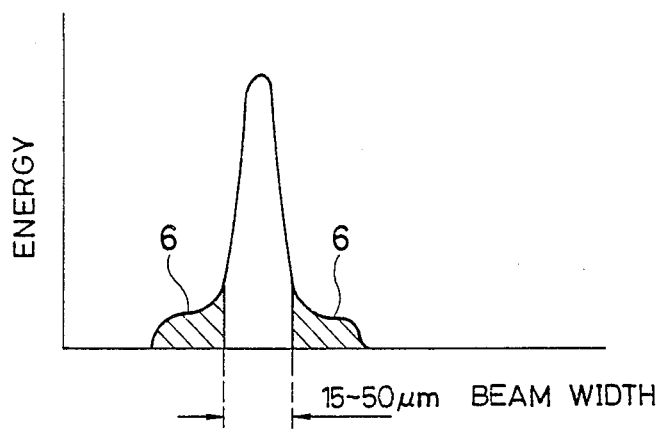
FIG. 1 is a graphic diagram showing the energy distribution along the thickness of a laser beam.
Figure 2:
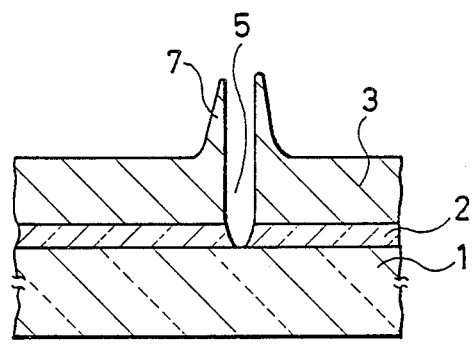
FIG. 2 is a partial section view showing the condition of the vicinity of a groove formed in accordance with prior art.
Figure 3A:
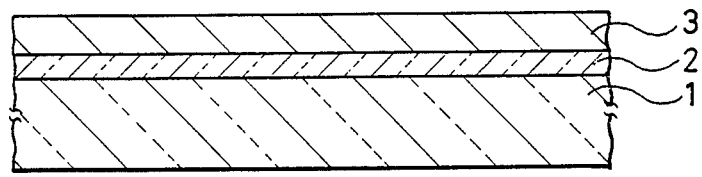
FIGS. 3(A) to 3(E) are cross sectional views showing a method of manufacturing a solar cell in accordance with the present invention.
Figure 3B:
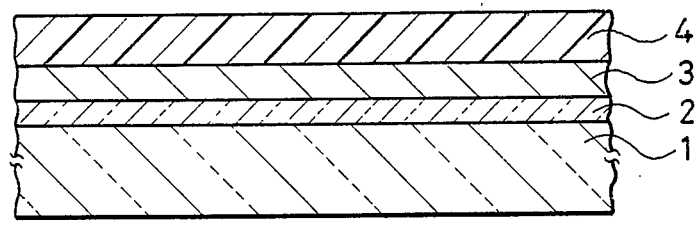
Figure 3C:
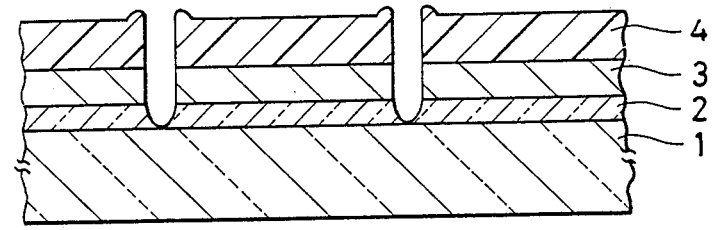
Figure 3D:
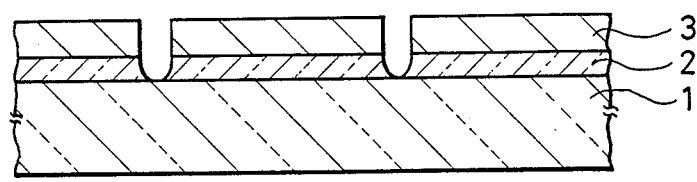

After the deposited films are heated in an oven at 80° C. for twenty minutes for the purpose of elimination of water involved in the the films to be processed, the upper surface of the amorphous film 3 is coated by spin coating with a 1.5 microns in thickness buffer film 4 made of a photoresist (FIG. 3(B)). The photoresist buffer film 4 is then subjected to pre-baking at 80° C. for twenty minutes and post-baking at 95° C. for thirty minutes.

Figure 3E:
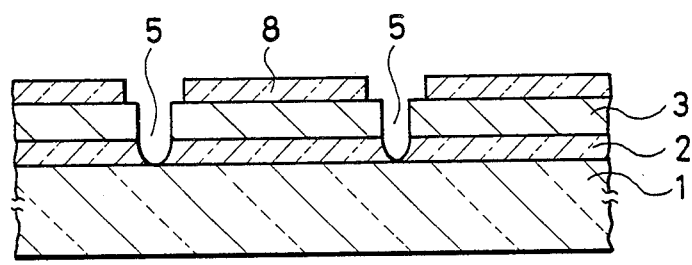

Prescribed portions of the films are irradiated with a laser beam emitted from an eximer laser having a wavelength of 248.7 nm, a power density of 1 $J/cm^2$, a pulse width of 10–20 microseconds. The laser beam is shaped in advance to have a cross section 20 microns thick and 20 cm long. A 20 cm long groove is formed on the films 2, 3 and 4 deposited on the substrate 1 by irradiating the pulsed laser beam 1–20 times (FIG. 3(C)). After the formation of the grooves, the buffer film 4 is removed with a solvent (FIG. 3(D)). The upper surface of the semiconductor film 3 is coated with the other electrode 8 by a known evaporation deposition as illustrated in FIG. 3(E).

Figure 4:
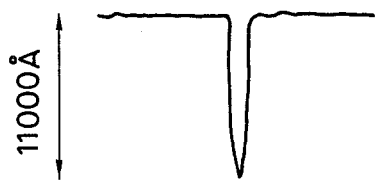
FIG. 4 is a schematic illustration showing the configuration of a groove which has been formed by laser scribing using a buffer film.
Figure 5:
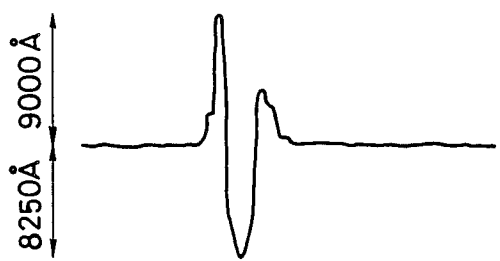
FIG. 5 is a schematic illustration showing the configuration of a groove which has been formed by laser scribing without the use of a buffer film.
Figure 6:
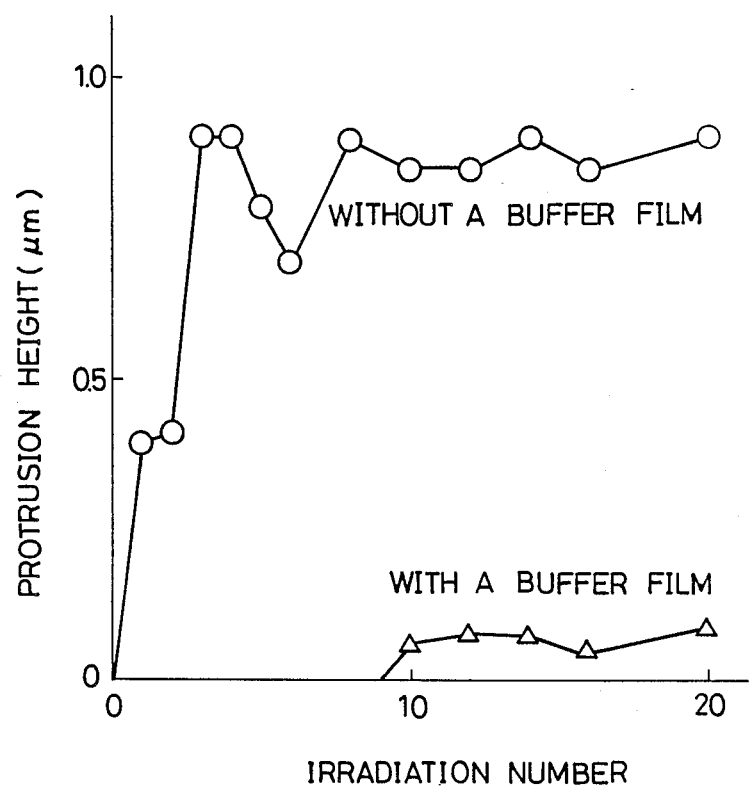
FIG. 6 is a graphical diagram showing the height of protrusion formed by irradiation of laser beam versus the repeating number of the irradiation.

The profile of the surface processed by laser scribing was measured by a step height measuring apparatus. As a result, the height of the protrusion formed along a 11000 Å deep groove was almost zero as illustrated in FIG. 4 while without the use of the buffer film, the formation of a 8250 Å deep groove was accompanied by the formation of a protrusion 9000 Å high as illustrated in FIG. 5.

The relation between the height of protrusion and the number of irradiation was also examined. In case without a buffer film, a substantially high protrusion was formed even by only a single irradiation and the height increased by several times irradiation to nearly 10 microns. In contrast, in case with a buffer film, no protrusion appeared by 9 or fewer times irradiation. Even in the latter case, a protrusion was also formed when irradiation is repeated for 10 or more times, however the height was limited up to 0.1 micron. When the laser scribing was performed deeply to sever the underlying $SnO_2$ film, the insulating resistance was measured to $10^8$ or higher ohm by six times irradiation in cases without a buffer film or by 8 times irradiation in cases with a buffer film.

Although in this embodiment the semiconducor film is scribed together with the underlying $SnO_2$ film, only the overlying film can be scribed allowing the underlying film to remain by suitably selecting the irradiation condition.

Next, another embodiment will be described. In this embodiment, a transparent conductive $SnO_2$ film on a glass substrate is patterned into a plurality of conductive parallel strips 300 microns wide and 300 mm long at an interval of 20 microns for use in liquid crystal device manufacture.

Like the previous embodiment, a photoresist film is formed on the entire surface of the $SnO_2$ film followed by baking. The thickness of the buffer film is 1.2 microns. Then, each groove of the pattern is formed on the conductive and buffer films by repeating irradiation for 7 times with a flat laser beam (248 nm) having a cross secion of 20 microns $\times$ 300 mm and a pulse width of 15 microseconds emitted from an eximer laser (KrF). After completion of patterning, the buffer film is removed with a suitable solvent.

Two glass substrates provided with transparent conductive patterns in accordance with the above process were given orientation control surfaces at their inside and mated at an interval of 3 microns. When a liquid crystal was disposed between the substrates, no disturbance to the liquid crystal molucular orientation was observed in the light of non-existence of protrusion.

Figure 7A:
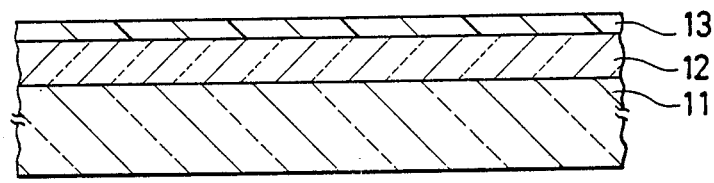
FIGS. 7(A) to 7(B) are cross sectional views showing a method of manufacturing a substrate for liquid crystal device in accordance with the present invention.
Figure 7B:
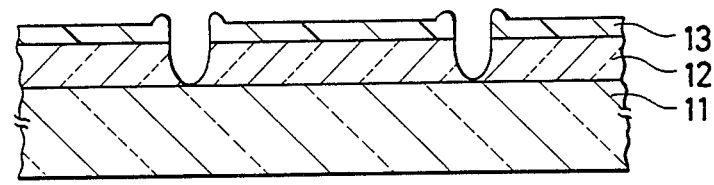

In accordance with experiment, when the buffer film is made from an organic resin, the protrusion formed on the upper surface of that buffer film was found small. For this reason, the buffer film may remain even with the product depending on the case. One example will be described in conjunction with FIGS. 7(A) and 7(B) illustrating a method of manufacturing a substrate provided with an electrode arragement and an orientation control film thereon. In general, orientation control films are made from organic resin.

An ITO, indium-tin oxide film 12 is formed on a glass substrate 11 to provide an electrode arragement for liquid crystal device. On the conductive film 12 is covered a nylon film 13. The upper surface of the nylon film is given a rubbing treatment to produce an orientation control surface. Then, a prescribed portion of the bilayer 12 and 13 is removed by the same way as in the foregoing explanation for the previous embodiment. A liquid crystal device is made by mating the substrate with a counterpart substrate and filling a space between the two substrates with a liquid crystal such as a ferroelectric liquid crystal. The buffer film 13 remains functioning in the liquid crystal device to orient the liquid crystal.

While a description has been made for several embodiments, the present invention should be limited only by the appended claims and should not be limited by the particular examles. For instance, any material can be used to form the buffer film instead of photoresists, as long as that material can absorb the tails of laser beams.

We claim:

1. A method of producing patterns on a first film formed on a substrate, the method comprising the steps of:
    coating said first film with an organic buffer film;
    irradiating said film with a laser beam through said organic buffer film;
    removing the irradiated portions of said first film together with the overlying portions of said organic buffer film while leaving said substrate substantially intact to produce said patterns on said first film;
    removing said organic buffer film with a solvent; and
    forming a second film on said first film.

2. The method of claim 1 wherein said first film is a semiconductor film.

3. The method of claim 1 wherein said first film is made from a conductive material.

4. The method of claim 1 wherein said organic buffer film is made from an organic resin.

5. The method of claim 1 wherein said buffer film is made from a photoresist.

6. The method of claim 1 wherein said laser beam is a pulsed beam.

7. The method of claim 6 wherein the wavelength of said laser beam is 400nm or less.

8. The method of claim 7 wherein said laser beam is emitted from an eximer laser.

9. In a method of patterning a film, the steps of coating said film with a buffer film made of an organic resin;
    irradiating said film and said buffer film with a laser beam; and
    removing the irradiated portions of said film and said buffer film by virtue of the laser energy.

10. The method of claim 9 wherein said film underlying said buffer film is made of indium-tin oxide.

11. The method of claim 10 adapted for manufacture of liquid crystal device.

12. The method of claim 1 wherein the formation of protrusions on said first film is prevented by said organic buffer film.

* * * * *